United States Patent
Yi et al.

(10) Patent No.: US 7,859,858 B2
(45) Date of Patent: Dec. 28, 2010

(54) LOCKING HINGE DESIGN

(75) Inventors: George Youzhi Yi, Fremont, CA (US);
Po-Chiang Tseng, Taipei County (TW);
Ming-Chien Chiu, Taipei County (TW)

(73) Assignee: Cisco Technology, Inc., San Jose, CA (US)

( * ) Notice: Subject to any disclaimer, the term of this patent is extended or adjusted under 35 U.S.C. 154(b) by 365 days.

(21) Appl. No.: 12/118,806

(22) Filed: May 12, 2008

(65) Prior Publication Data
US 2009/0279267 A1    Nov. 12, 2009

(51) Int. Cl.
*H05K 7/14*    (2006.01)
*H05K 7/18*    (2006.01)

(52) U.S. Cl. .................. 361/801; 361/802; 361/803

(58) Field of Classification Search .......... 361/752, 361/790, 797, 800–802, 749, 755, 600, 730; 312/223.01, 223.02; 16/366, 342
See application file for complete search history.

(56) References Cited

U.S. PATENT DOCUMENTS

| 6,909,047 B2 * | 6/2005 | Zhang | 174/50 |
| 7,457,135 B2 * | 11/2008 | Chen et al. | 361/816 |
| 7,525,811 B2 * | 4/2009 | Xiao | 361/759 |

* cited by examiner

*Primary Examiner*—Hung S Bui
(74) *Attorney, Agent, or Firm*—Tucker Ellis & West LLP

(57) ABSTRACT

In accordance with an example embodiment, there is disclosed herein an apparatus comprising a top case having a top surface and a side surface and a bottom case having a bottom surface and a side surface. The top case comprises a flange protruding from the side surface, the flange having at least one extended surface. The bottom case has an aperture having portions extending from the bottom surface to the side surface. The portion of the aperture extending along the bottom surface is configured to have sufficient width to allow the entire flange to pass through. The side surface of the bottom case has a vertical post such that the base section of the flange passes through the portion of the aperture on the side surface while vertical post retains the at least one extended surface.

20 Claims, 5 Drawing Sheets

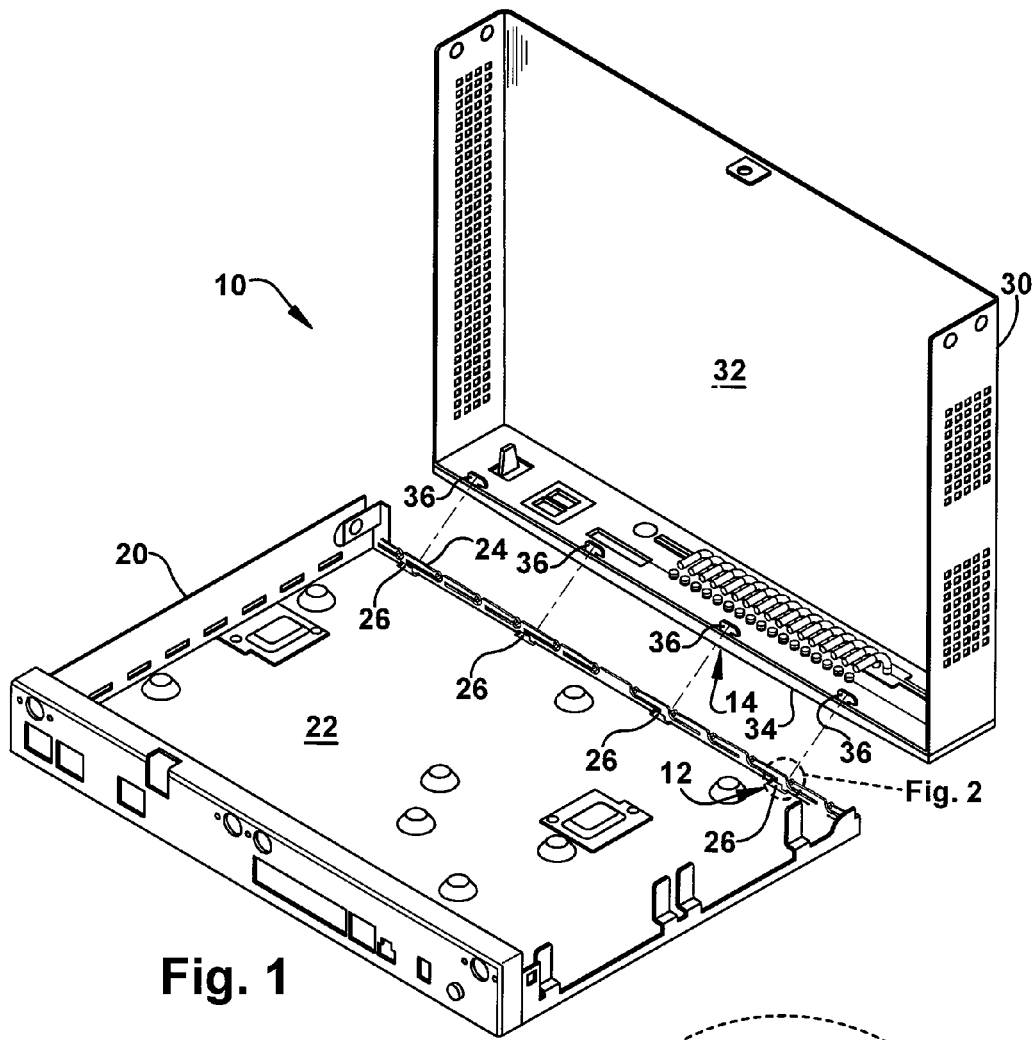
Fig. 1
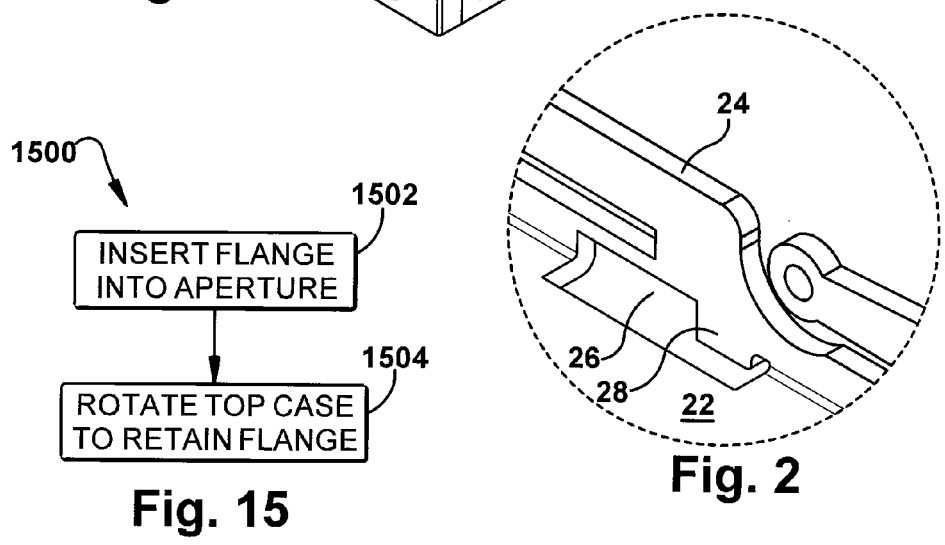
Fig. 15
Fig. 2

LOCKING HINGE DESIGN

TECHNICAL FIELD

The present disclosure relates generally to a hinge design for chassis assembly.

BACKGROUND

Many chassis designs for electronic devices, such as for network and wireless network devices, employ a sliding assembly: The top case of the chassis slides against the bottom case to close. The sum of (Electro-Magnetic Interference) EMI spoons or EMI finger stocks can result in a large friction force during the sliding installation. The sliding installation is difficult and inefficient. In contrast with the sliding assembly, a flip assembly is design employs a hinge structure: The top case is hinged on one side with the bottom case. The top case flips to close. A hinge assembly avoids the large friction force and makes the assembly easier and more efficient; however, existing hinged chassis designs suffer from unstable surface contact between the top case and the bottom case along the hinge side, and uncontrollable flatness tolerance on the hinge side.

BRIEF DESCRIPTION OF THE DRAWINGS

The accompanying drawings incorporated herein and forming a part of the specification illustrate the examples embodiments.

FIG. 1 is a perspective view of a chassis configured in accordance with an example embodiment.

FIG. 2 is detailed view of the bottom case of the chassis.

FIG. 15 illustrates an example methodology.

OVERVIEW OF EXAMPLE EMBODIMENTS

Figure 3:
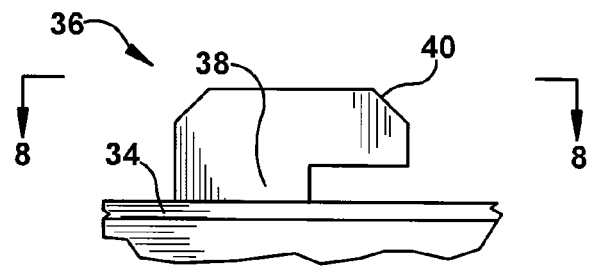
FIG. 3 is an example top view of the side section of the top case of the chassis.

The following presents a simplified overview of the example embodiments in order to provide a basic understanding of some aspects of the example embodiments. This overview is not an extensive overview of the example embodiments. It is intended to neither identify key or critical elements of the example embodiments nor delineate the scope of the appended claims. Its sole purpose is to present some concepts of the example embodiments in a simplified form as a prelude to the more detailed description that is presented later.

In accordance with an example embodiment, there is disclosed herein an apparatus comprising a top case having a top surface and a side surface and a bottom case having a bottom surface and a side surface. The top case comprises a flange protruding from the side surface, the flange having at least one extended surface. The bottom case has an aperture having portions extending from the bottom surface to the side surface. The portion of the aperture extending along the bottom surface is configured to have sufficient width to allow the entire flange to pass through. The side surface of the bottom case has a vertical post such that the base section of the flange passes through the portion of the aperture on the side surface while vertical post retains the at least one extended surface.

DESCRIPTION OF EXAMPLE EMBODIMENTS

This description provides examples not intended to limit the scope of the appended claims. The figures generally indicate the features of the examples, where it is understood and appreciated that like reference numerals are used to refer to like elements.

Described herein in an example embodiment is a locking hinge design that contains two unique key structures. The first is an L shaped flange on the top case, and the second is a vertical return-stop plate on the bottom case. After the top case is installed to the bottom case, the return-stop plate on the bottom case retains the L shaped flange on top case. Because of the locking hinge, the top case is no longer to slide away from the bottom case, which results in reliable surface contact between the top case and the bottom case. This can result in improved assembly quality. Moreover, the locking hinge design may enable a chassis is able to meet Federal Communication Commission (FCC) class B requirements.

FIG. 1 illustrates a perspective view of a chassis 10 configured in accordance with an example embodiment. Chassis 10 comprises a bottom case 20 and a top case 30. Bottom case 20 has a bottom surface 22 and a side surface 24. Top case 30 has a top surface 32 and a side surface 34.

A hinge assembly described herein is employed to affix top case 30 and bottom case 20. The hinge assembly comprises an aperture 26 configured to accept a flange 36 through the bottom surface. The hinge assembly further comprises a vertical post (see 28 FIG. 2) on side surface 24 for retaining an extended surface of flange 36 (which will be described in further detail herein) while the base portion of the flange 36 passes through a portion of the aperture on side surface 24. The example illustrated in FIG. 1 has four flanges and four corresponding apertures, however, those skilled in the art can readily appreciate that the example embodiments illustrated herein are adaptable for any physically realizable number of flanges with corresponding apertures (e.g. 1, 2, 3, 4, etc.).

Referring to FIG. 2 with continued reference to FIG. 1, there is illustrated an example exploded perspective view of area 12 of bottom case 20 of chassis 10. Aperture 26 extends across bottom surface 22 and side surface 24 of bottom case 20. The portion of aperture 26 on bottom surface 22 is configured to accept a flange from top case 30. A vertical post (or return stop) 28 on side surface 24 of bottom case 20 decreases the size of aperture 26 on side surface 24. As will be described in more detail herein, vertical post 28 enables the base of a flange having an extended portion, for example an L shaped flange, to pass through the portion of aperture 26 on side surface 24 while vertical stop 28 retains the extended surface of the flange.

FIG. 3 is an example top view of the side section 34 of top case 30 of chassis 10. In this example, flange 36 comprises a base section 38 and an extended surface 40. As will be described in more detail herein, base section 38 and extended surface 40 are enabled to pass through an aperture 26 on the bottom surface 22 of case 20, while the extended section is retained by vertical post 28.

Figure 4:
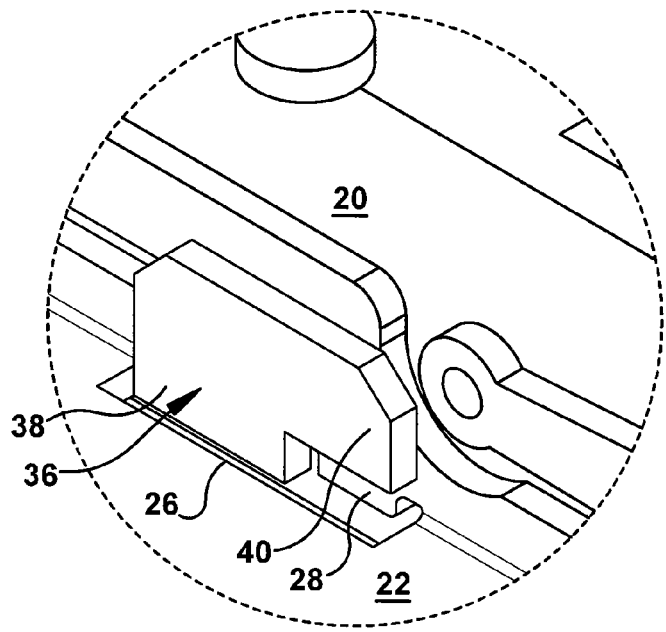
FIG. 4 is an example perspective view illustrating the hinge assembly when the top case is hinged with the bottom case.

FIG. 4 is an example perspective view illustrating installation of the top case 20 with the bottom case 30. In this example, top case 30 is hinged with bottom case 20, but top case 30 has not been moved into a closed (assembled) position. The width of aperture 26 on bottom surface 22 is sufficient to enable all of flange (base section 38 and extended surface 40) 36 to pass through aperture 26.

Figure 5:
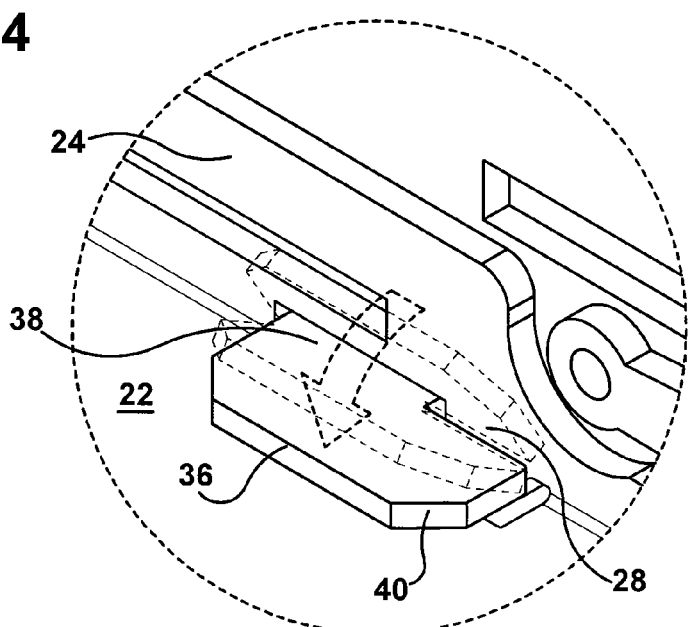
FIG. 5 is an example perspective view illustrating the hinge assembly when the chassis has been assembled.

FIG. 5 is an example perspective view illustrating the hinge assembly after assembly of chassis 20. Flange 36 has been rotated (as illustrated by the dotted line ghost images) such that the base portion 38 of flange 36 passes through a portion of aperture 26 along side surface 24. Vertical post 28 retains the extended portion 40 of flange 36. The prevents base portion 38 from sliding out of aperture 26.

Figure 6:
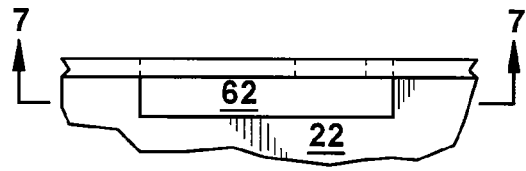
FIG. 6 is an example of a top view of the bottom section of the bottom case.
Figure 7:
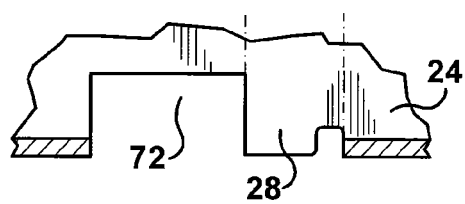
FIG. 7 is an example of a side view of the side section of the bottom case.

FIG. 6 is an example of a top view of the bottom section 22 of the bottom case 20. The portion of aperture 26 projecting onto bottom section 22 is illustrated by 62. FIG. 7 illustrates an example of a side view of the side section 24 of the bottom case 20. The portion of aperture 26 projecting along side section 24 is represented by 72. The vertical post is represented by 26. Note that the portion of aperture 26 projecting on side surface 24 (represented by 72) is smaller in width than the portion of aperture 26 projecting on bottom surface 22 (represented by 62). This feature enables the entire flange to pass through the bottom surface 22 of bottom case 20, while retaining the flange when the flange has been rotated to the closed position.

Figure 8:
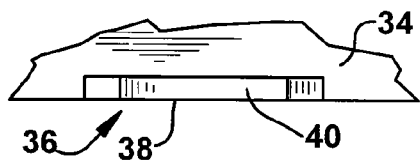
FIG. 8 is an example of a side view of the side section of the top case.

FIG. 8 is an example of a side view of the side section 34 of top case 30. From this view, the length of flange 36 includes the length of base portion 38 and extended surface 40.

Figure 10:
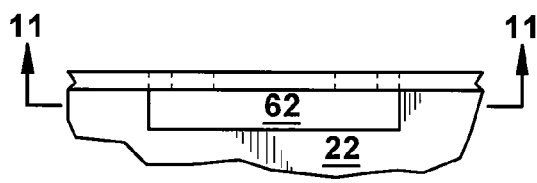
FIG. 10 is an example of a top view of the bottom section of the bottom case for use with a T shaped flange.
Figure 9:
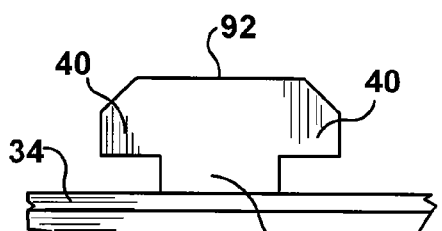
FIG. 9 is an example top view of the side section of the top case of the chassis with a T shaped flange.
Figure 11:
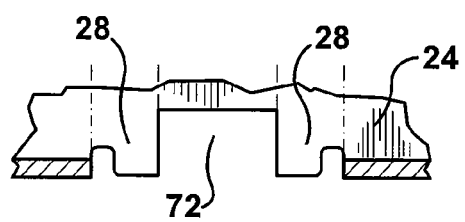
FIG. 11 is an example of a side view of the side section of the bottom case for use with a T shaped flange.

FIG. 9 is an example top view of the side section of the top case of the chassis with a T shaped flange 92. T shaped flange 92 comprises two extended surfaces 40 protruding from base section 38. FIGS. 10 and 11 illustrate a corresponding bottom section 22 and side section 24 of a bottom case 20 configured to accept T shaped flange 92. The length of the portion of the aperture projecting on the bottom surface 22 (represented by 62) is sufficient to accommodate the base section 38 and both extended surfaces 40 of T shaped flange 92. Side surface 24 has two vertical posts 28. Aperture 72 is sufficient to allow the base 38 of T shaped flange 92 to pass through, but vertical posts 26 retain extended surfaces 40.

Figure 12:
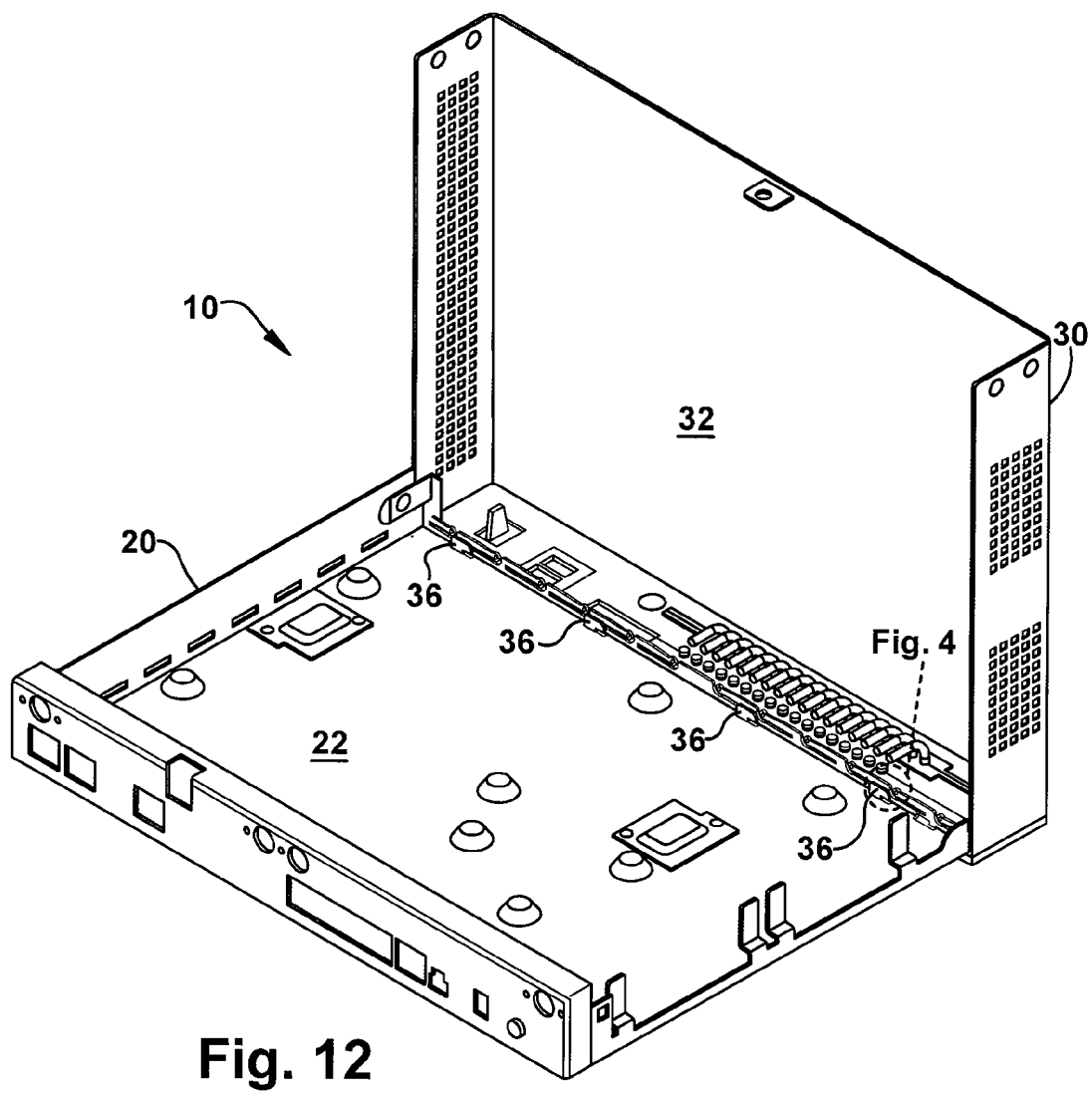
FIG. 12 illustrates an example of the top case engaging the bottom case.
Figure 13:
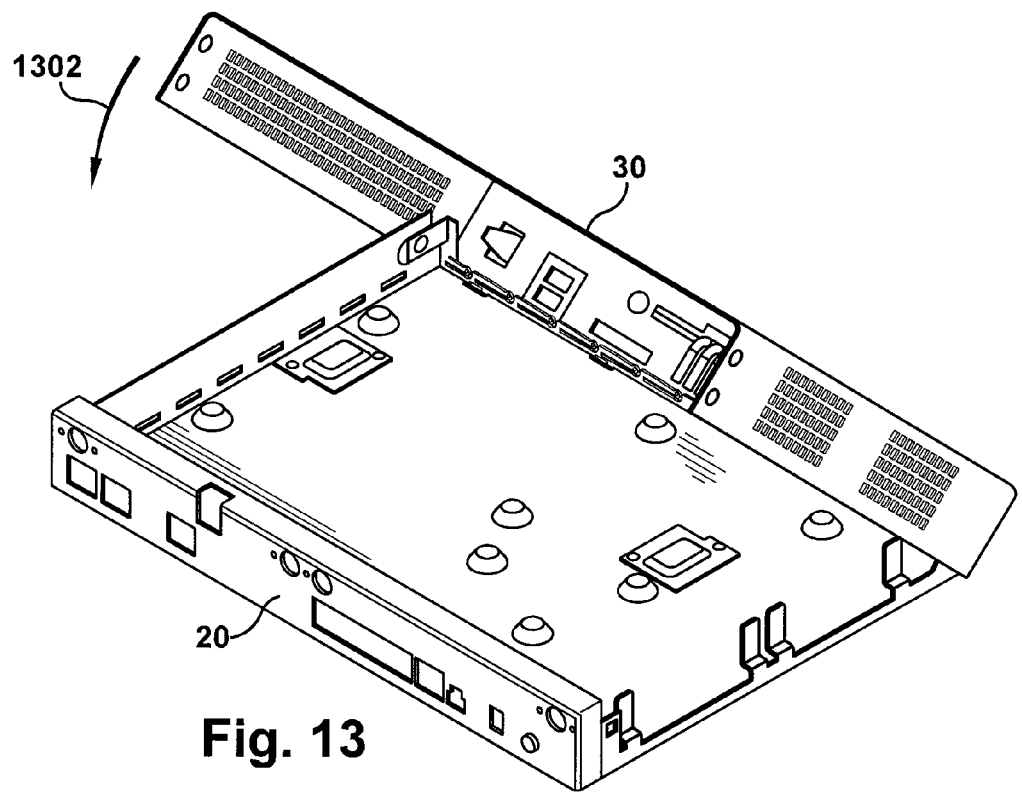
FIG. 13 illustrates an example of the top case rotating to a closed position while engaged with the bottom case.
Figure 14:
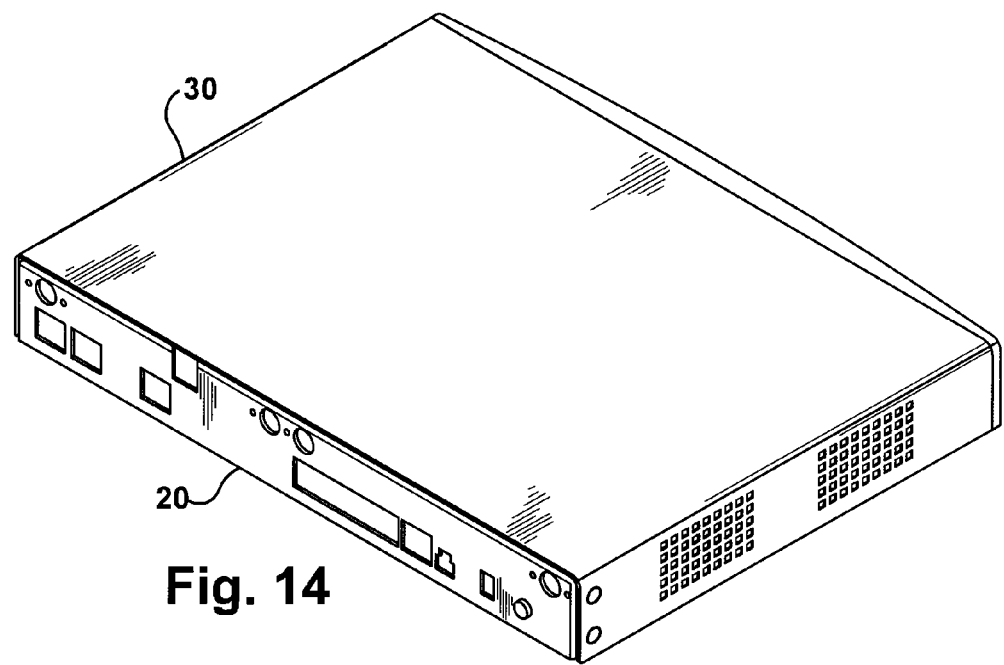
FIG. 14 illustrates an example of the top case in a closed position with the bottom case.

FIG. 12 illustrates an example of the top case 30 engaging the bottom case 20. In this position, flange (or flanges) of top case 30 pass through corresponding apertures in bottom surface 20 as described herein. FIG. 13 illustrates an example of the top case 30 rotating to a closed position while engaged with the bottom case 20. Top case 30 is rotated in the direction indicated by 1302. FIG. 14 illustrates the top case 30 in a closed position with the bottom case 20.

In view of the foregoing structural and functional features described above, a methodology in accordance with an example embodiment will be better appreciated with reference to FIG. 15. While, for purposes of simplicity of explanation, the methodology of FIG. 15 is shown and described as executing serially, it is to be understood and appreciated that the example embodiment is not limited by the illustrated order, as some aspects could occur in different orders and/or concurrently with other aspects from that shown and described herein. Moreover, not all illustrated features may be required to implement a methodology in accordance with an aspect the example embodiment.

FIG. 15 illustrates a methodology 1500 for employing a locking hinge design in accordance with an example embodiment. Methodology 1500 is suitable for a locking hinge as described herein, for example, a chassis with a top case and bottom case, where the top case has a flange with a protruding section and the bottom case has an aperture extending from a bottom surface to a side surface, where the size of the aperture on the bottom surface is sufficient to allow the flange to pass through, and the side surface having a post for retaining the protruding section and the size of the aperture on the side section sufficient to allow the base section of the flange to pass through.

At 1502, the flange is inserted into the aperture. In an example embodiment, the side surface of the top case is parallel to the bottom surface of the bottom case. In an example embodiment, the flange protrudes perpendicularly from the side section of the top case. The flange may be inserted as illustrated in FIG. 4, and top and bottom cases aligned as illustrated in FIG. 12.

At 1504, the top case is rotated, transitioning the hinge assembly to the locked position. FIG. 13 illustrates the relationship of the top case and bottom case in an example embodiment, as the top case transitions from the open position to the closed position. FIG. 14 illustrates the top case in the closed position in accordance with an example embodiment. FIG. 5 illustrates an example embodiment with the hinge in the closed position. The base portion of the hinge passes through an aperture in the side section of the bottom case while a vertical post retains the protruding section.

In an example embodiment, the hinge assembly described herein is used with a chassis for network device such as an access point. The network device is assembled using the method described in FIG. 15 and employing components illustrated in FIGS. 1-14. This embodiment can reduce electro-magnetic emissions from within the network device. For example, while the top case is closed, the flange covers the aperture on the bottom surface and the extended surface extends from the aperture in the side surface of the bottom case to the vertical post, covering a gap between the base portion and the side of the bottom case. Hinges employing a flange without an extended surface would have an additional gap between the base portion of the flange and the side of the bottom case. The ability to reduce the number of gaps between the flange and the side surface of the bottom case can result in reduced electro-magnetic emissions from within the case, which may enable the case to meet regulatory requirements for Electro-magnetic Compliance such as FCC class B.

Described above are example embodiments. It is, of course, not possible to describe every conceivable combination of components or methodologies, but one of ordinary skill in the art will recognize that many further combinations and permutations of the example embodiments are possible. Accordingly, this application is intended to embrace all such alterations, modifications and variations that fall within the spirit and scope of the appended claims interpreted in accordance with the breadth to which they are fairly, legally and equitably entitled.

The invention claimed is:

1. An apparatus, comprising:
    a top case having a top surface and a side surface; and,
    a bottom case having a bottom surface and a side surface;
    wherein the top case comprises a flange protruding from the side surface, the flange having a base portion and at least one extended surface;
    wherein the bottom case comprises a vertical post on the side surface and an aperture having portions extending from the bottom surface to the side surface,
    wherein a first portion of the aperture extending along the bottom surface of the bottom case has sufficient width to selectively allow the entire flange to pass therethrough with the top and bottom cases disposed in a first relative orientation,
    wherein, with the top and bottom cases disposed in a second relative orientation, the base portion of the flange passes through a second portion of the aperture on the side surface of the bottom case, the vertical post retains the at least one extended surface of the flange, and the extended surface of the flange covers the first portion of the aperture on the bottom surface of the bottom case.

2. The apparatus of claim 1, wherein the flange is L shaped.

3. The apparatus of claim 1, wherein the flange is T shaped.

4. The apparatus of claim 1, wherein the top case has a plurality of flanges protruding from the side surface and wherein the bottom case has a plurality of apertures extending from the bottom surface to the side surface of the bottom case corresponding to the plurality of flanges.

5. The apparatus of claim 1, wherein the top case has a two flanges protruding from the side surface and wherein the bottom case has a two apertures extending from the bottom surface to the side surface of the bottom case corresponding to the two flanges.

6. The apparatus of claim 1, wherein the top case has a three flanges protruding from the side surface and wherein the bottom case has a three apertures extending from the bottom surface to the side surface of the bottom case corresponding to the three flanges.

7. The apparatus of claim 1, wherein, with the top and bottom cases disposed in the second relative orientation:
    the base portion and the at least one extended surface of the flange cover the first portion of the aperture; and,
    the base portion of the flange covers the second portion of the aperture.

8. The apparatus of claim 1, wherein the portion of the aperture on the bottom surface is configured to accept the flange from the top case while the side surface of the top case is substantially parallel to the bottom surface; and
    wherein the portion of the aperture on the side surface of the bottom case and the vertical post are configured to retain the at least one extended surface while the side surface of the top case is substantially perpendicular to the bottom surface.

9. The apparatus of claim 1, wherein the top case has four L shaped flanges with a corresponding extended surface;
    wherein the bottom case has four apertures having a portion on the bottom surface and the side surface of the bottom case corresponding to the L shaped flanges and four vertical posts;
    wherein the portions of the apertures on the bottom surface are configured to accept the corresponding flanges from the top case while the side surface of the top case is substantially parallel to the bottom surface; and
    wherein the portion of the apertures on the side surfaces of the bottom case and the vertical posts are configured to retain the extended surfaces of the L shaped flanges.

10. The apparatus of claim 1, wherein the top case has four T shaped flanges with a corresponding extended surfaces;
    wherein the bottom case has four apertures having a portion on the bottom surface and the side surface of the bottom case corresponding to the T shaped flanges and vertical posts;
    wherein the portions of the apertures on the bottom surface are configured to accept the corresponding flanges from the top case while the side surface of the top case is substantially parallel to the bottom surface; and
    wherein the portion of the apertures on the side surfaces of the bottom case and the vertical posts are configured to retain the extended surfaces of the T shaped flanges.

11. A method, comprising:
    inserting a flange having a base portion and at least one extended surface protruding from a side surface of a top case into an aperture on a bottom surface of a bottom case; and
    rotating at least one of the top and bottom cases relative to the other of the top and bottom cases such that the flange is biased against the bottom surface;
    wherein the bottom case has a side surface, the side surface having a vertical post adjacent to an aperture in communication with the aperture on the bottom surface;
    wherein after the at least one of the top has and bottom cases have been rotated, the vertical past retains the extended surface of the flange while the base portion of the flange passes through the aperture on the side surface of the bottom case, and while the flange covers the aperture on the bottom surface of the bottom case.

12. The method of claim 11, wherein the flange is an L shaped flange.

13. The method of claim 11, wherein the flange is a T shaped flange.

14. The method of claim 11, wherein the top case has a plurality of flanges and the bottom case has a plurality of apertures corresponding to the plurality of flanges.

15. The method of claim 11, wherein the top case has two flanges and the bottom case has two apertures corresponding to the two flanges.

16. The method of claim 11, wherein the top case has three flanges and the bottom case has three apertures corresponding to the three flanges.

17. The method of claim 11, wherein the top case has four flanges and the bottom case has four apertures.

18. The method of claim 11, wherein the portion of the aperture on the bottom surface is configured to accept the flange from the top case while the side surface of the top case is substantially parallel to the bottom surface; and
    wherein the portion of the aperture on the side surface of the bottom case and the vertical post are configured to retain the at least one extended surface while the side surface of the top case is substantially perpendicular to the bottom surface.

19. The method of claim 11, wherein the top case has four L shaped flanges with corresponding extended surfaces;
    wherein the bottom case has four apertures having a portion on the bottom surface and a portion on the side surface of the bottom case corresponding to the L shaped flanges and four vertical posts;
    wherein the portions of the apertures on the bottom surface are configured to accept the corresponding flanges from the top case while the side surface of the top case is substantially parallel to the bottom surface; and
    wherein the portion of the apertures on the side surfaces of the bottom case and the vertical posts are configured to retain the extended surfaces of the L shaped flanges.

20. The method of claim 11, wherein the top case has four T shaped flanges with a corresponding extended surfaces;
  wherein the bottom case has four apertures having a portion on the bottom surface and the side surface of the bottom case corresponding to the T shaped flanges and vertical posts;
  wherein the portions of the apertures on the bottom surface are configured to accept the corresponding flanges from the top case while the side surface of the top case is substantially parallel to the bottom surface; and
  wherein the portion of the apertures on the side surfaces of the bottom case and the vertical posts are configured to retain the extended surfaces of the T shaped flanges.

* * * * *